United States Patent [19]

Proebsting

[11] 4,347,447
[45] Aug. 31, 1982

[54] CURRENT LIMITING MOS TRANSISTOR DRIVER CIRCUIT

[75] Inventor: Robert J. Proebsting, Carrollton, Tex.

[73] Assignee: Mostek Corporation, Carrollton, Tex.

[21] Appl. No.: 275,056

[22] PCT Filed: Apr. 16, 1981

[86] PCT No.: PCT/US81/00497
§ 371 Date: Apr. 16, 1981
§ 102(e) Date: Apr. 16, 1981

[51] Int. Cl.³ ............... H03K 19/003; H03K 19/007; H03K 19/094; H03K 17/16
[52] U.S. Cl. .................. 307/548; 307/442; 307/448; 307/450; 307/473
[58] Field of Search ............... 307/270, 442, 443, 448, 307/450, 451, 473, 542, 548–551, 555, 568, 574, 575, 581, 584

[56] References Cited

U.S. PATENT DOCUMENTS

| | | | |
|---|---|---|---|
| 3,651,340 | 3/1972 | Cliff | 307/451 |
| 3,906,255 | 9/1975 | Mensch, Jr. | 307/473 X |
| 3,913,026 | 10/1975 | Koehler | 307/450 X |
| 4,065,678 | 12/1977 | Reese et al. | 307/546 |
| 4,096,398 | 6/1978 | Khaitan | 307/270 X |
| 4,275,313 | 6/1981 | Boll et al. | 307/270 X |

OTHER PUBLICATIONS

Homan, "FET Depletion Load Push–Pull Logical Circuit"; IBM Tech. Discl. Bull.; vol. 18, No. 3, pp. 910–911; 8/1975.

Primary Examiner—Larry N. Anagnos

[57] ABSTRACT

A current limiting driver circuit (10) receives a first logic level input signal ($\phi_1$) and drives an output pin (26). A node (14) is pulled to ground by a pull-down transistor (16) which receives the first input signal ($\phi_1$) and is driven to a high voltage state by a pull-up transistor (12). A driver transistor (28) is turned on by a high voltage state at the node (14) and is turned off by a low voltage state at the node (14). The driver transistor (28) is connected to provide a high voltage state to the output pin (26). A pull-down transistor (30) is connected to receive the first input signal ($\phi_1$) in order to pull the output pin (26) to ground. A series of transistors (18, 20, 22) are connected between the gate and source terminals of the driver transistor (28) such that when the gate-to-source voltage of the driver transistor (28) exceeds the combined thresholds of the three transistors (18, 20, 22) they will be turned on and thereby limit the maximum gate-to-source voltage of driver transistor (28). This in turn serves to limit the maximum current flow through the driver transistor (28). Disabling transistors (17, 32) are included for providing a high impedance output to the output pin (26).

15 Claims, 2 Drawing Figures

CURRENT LIMITING MOS TRANSISTOR DRIVER CIRCUIT

TECHNICAL FIELD

The present invention pertains to driver circuits in logic applications and more particularly pertains to such driver circuits which must have a current limited output.

BACKGROUND ART

In certain logic circuits an output data state is produced at an output terminal. The output terminal is then connected to deliver the output signal to other circuit elements. The output terminal is typically driven to high and low voltage states. If the output terminal should become grounded when the circuit is attempting to drive it to a high voltage state there may be a heavy current flow through the driving circuit. If no means are provided for limiting current flow through the output terminal, the surge of current can frequently be sufficient to damage the driving circuit. The provision of a current limiting resistor, however, has the disadvantage that it slows the driver circuit in driving the output terminal to the desired voltage state.

In view of the above problems there exists a need for a current limiting driver circuit in which the output terminal can be rapidly driven to the highest voltage state required while at the same time having a limitation on the current which can be transmitted through the output terminal to prevent damaging the driver circuit or related circuits.

SUMMARY OF THE INVENTION

In a selected embodiment of the present invention a current limiting circuit is described which drives an output node to selected logic states in response to an input signal. A driver transistor is included in the circuit and has the gate terminal thereof connected to receive a control signal, the drain terminal thereof connected to a power terminal and the source terminal thereof connected to the output node. Circuitry is connected between the gate and source terminals of the driver transistor to limit the maximum voltage difference therebetween to a predetermined voltage thereby limiting the current flow through the driver transistor. In a further aspect of the present invention circuitry is provided to isolate the output node to leave it in a high impedance condition.

BRIEF DESCRIPTION OF THE DRAWINGS

For a more complete understanding of the present invention and the advantages thereof, reference is now made to the following Description taken in conjunction with the accompanying Drawings in which.

DETAILED DESCRIPTION

Figure 1:
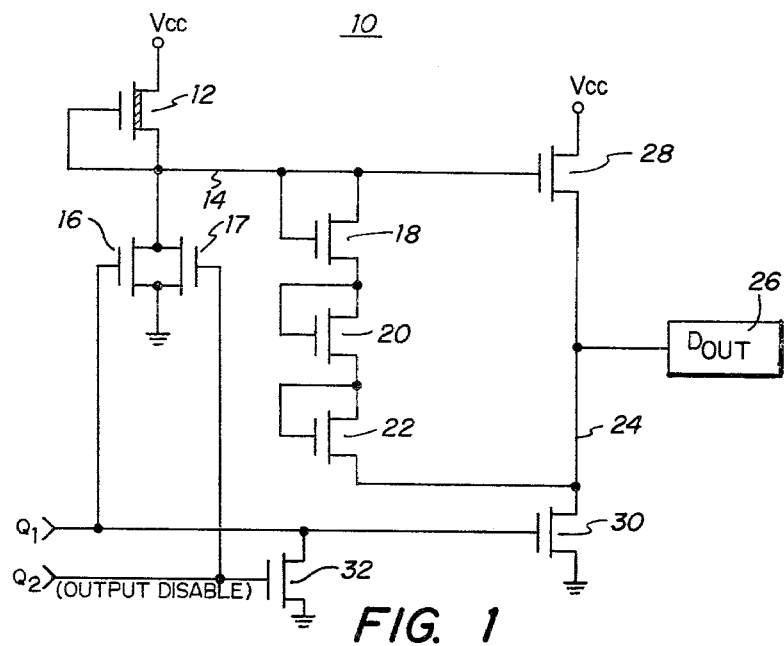
FIG. 1 is a schematic illustration of a first embodiment of a current limiting driver circuit and FIG. 2 is a schematic illustration of a second embodiment of a current limiting driver circuit.

A first embodiment of a current limiting driver circuit in accordance with the present invention is illustrated in FIG. 1 and designated generally by the reference numeral 10. Circuit 10 includes a depletion mode pull-up transistor 12 which has the gate and source terminals thereof connected to a node 14. The drain terminal of transistor 12 is connected to a first power terminal $V_{cc}$.

A pull-down transistor 16 has the gate terminal connected to receive a logic level input signal $\phi_1$. The drain terminal of transistor 16 is connected to node 14 and the source terminal of transistor 16 is connected to ground.

A pull-down transistor 17 has the gate terminal thereof connected to receive a logic level input signal $\phi_2$. The drain terminal of transistor 17 is connected to node 14 and the source terminal is connected to ground.

A transistor 18 has the gate and drain terminals thereof connected to node 14. A transistor 20 has the gate and drain terminals thereof connected to the source terminal of transistor 18. A transistor 22 has the gate and drain terminals thereof connected to the source terminal of transistor 20. The source terminal of transistor 22 is connected to an output node 24 which is in turn connected to an output pin 26. Output data is transmitted through the pin 26.

A driver transistor 28 has the gate terminal thereof connected to node 14, the drain terminal thereof connected to the power terminal $V_{cc}$ and the source terminal thereof connected to the output node 24.

A pull-down transistor 30 has the gate terminal thereof connected to receive the logic level input signal $\phi_1$, the drain terminal thereof connected to node 24 and the source terminal thereof connected to ground.

A pull-down transistor 32 has the gate terminal thereof connected to receive the $\phi_2$ input signal, the drain terminal thereof connected to the line which receives the $\phi_1$ signal and the source terminal thereof grounded.

Operation of circuit 10 is now described in reference to FIG. 1. The purpose of circuit 10 is to drive the output pin 26 to a logic state determined by the state of the input signal $\phi_1$. It is the objective of circuit 10 that the output pin be driven very quickly between the logic states and that the output pin be pulled to a high voltage state, typically one $V_t$ (voltage threshold) below the supply voltage $V_{cc}$. However, there is the possibility through a system fault that the output pin 26 can become grounded when circuit 10 is attempting to drive it to a high logic state.

When the $\phi_1$ and $\phi_2$ signals are at the low voltage state transistors 16, 17 and 32 will be turned off. When transistors 16 and 17 are turned off transistor 12 pulls node 14 to a high voltage state. Note that the maximum voltage at node 14 can be limited as described below. When node 14 is at a high voltage state transistor 28 is turned on thereby pulling the output node 24 high. The $\phi_1$ signal turns off transistor 30 thereby isolating node 24 from ground. Under these conditions the output pin 26 is driven to a high voltage state.

When the input signal $\phi_1$ is at a high voltage state and the input signal $\phi_2$ is at a low voltage state transistors 16 and 30 will be turned on while transistors 17 and 32 will be turned off. When transistor 16 is turned on node 14 is pulled to ground which causes transistor 28 to be turned off. When transistor 30 is turned on the output node 24 is pulled to ground. The output pin 26 is thus driven to a low voltage state. When $\phi_2$ is at a low voltage state, the logic state at pin 26 is the complement of the logic state of $\phi_1$.

Whenever the input signal $\phi_2$ goes to a high voltage state transistors 17 and 32 are turned on. When transistor 17 is turned on node 14 is pulled to ground thereby turning off transistor 28. When transistor 32 is turned on the signal $\phi_1$ is forced to ground thereby turning off transistor 30. The output node 24 is thus left floating and a high impedance condition is presented to the output pin 26. Thus when the signal $\phi_2$ goes to a high voltage state the output of circuit 10 is disabled.

The transistors 18, 20 and 22 serve to limit the maximum voltage difference between the gate and source terminals of driver transistor 28. When the gate-to-source voltage of transistor 28 exceeds the cumulative threshold voltages ($V_T$) of transistors 18, 20 and 22 these transistors will be turned on thereby providing a relatively low impedance path between nodes 14 and 24 which in turn holds down the gate-to-source voltage of transistor 28. Since the current flow through transistor 28 is a function of the gate-to-source voltage the limiting of the bias voltage serves to also limit the maximum current flow through transistor 28.

The transistors 18, 20 and 22, however, do not restrict the maximum voltage to which pin 26 can be driven. Pin 26 can be driven to within one $V_T$ of $V_{cc}$ and under this condition the transistors 18, 20 and 22 will be turned off. But at any time when node 14 is at a high voltage state and pin 26 is grounded the transistors 18, 20 and 22 will be turned on reducing the voltage on node 14 to reduce the gate-to-source voltage of transistor 28 thereby limiting the current which flows into the output pin 26.

Transistors 17 and 32 are included in circuit 10 to provide a high impedance state to the output pin 26. If such a high impedance state is not required, these transistors can be deleted from circuit 10.

In a design example for a metal oxide semiconductor field effect transistor (MOSFET) integrated circuit each of the transistors is designed to have a minimum channel length. The transistors 18, 20 and 22 can have a width of 300 microns. The combined "on" impedance of transistors 18, 20 and 22 is made substantially smaller than the "on" impedance of transistor 12 such that node 14 is limited to a maximum voltage slightly more than 3 $V_t$ above the voltage at node 24.

Figure 2:
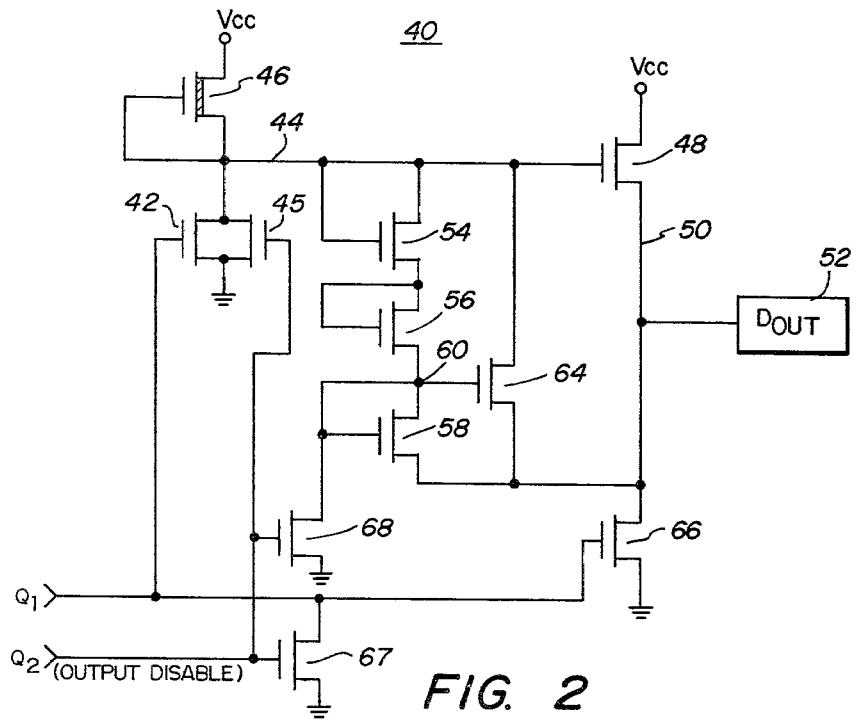

A further embodiment of the present invention is illustrated in FIG. 2 and the circuit therein is designated generally by the reference numeral 40. The first logic level input signal $\phi_1$ is supplied to the gate terminal of a pull-down transistor 42. The drain terminal of transistor 42 is connected to a node 44 and the source terminal of transistor 42 is connected to ground.

A pull-down transistor 45 receives the $\phi_2$ signal at the gate terminal thereof, has the drain terminal thereof connected to node 44 and the source terminal thereof grounded.

A pull-up depletion node transistor 46 has the gate and source terminals thereof connected to node 44 and the drain terminal thereof connected to the power terminal $V_{cc}$.

Node 44 is connected to the gate terminal of a driver transistor 48 which has the drain terminal thereof connected to the power terminal $V_{cc}$. The source terminal of transistor 48 is connected to an output node 50 which is in turn connected to a data output pin 52.

A transistor 54 has the gate and drain terminals thereof connected to node 44. A transistor 56 has the gate and drain terminals thereof connected to the source terminal of transistor 54. A transistor 58 has the gate and drain terminals thereof connected to a node 60 and the source terminal thereof connected to node 50. The source terminal of transistor 56 is connected to node 60.

A transistor 64 has the gate terminal thereof connected to node 60, the drain terminal thereof connected to node 44 and the source terminal thereof is connected to node 50.

A pull-down transistor 66 is connected to receive the logic level input signal $\phi_1$ at the gate terminal thereof. The drain terminal of transistor 66 is connected to node 50 and the source terminal thereof is connected to ground.

A pull-down transistor 67 has the gate terminal thereof connected to receive the input signal $\phi_2$, the drain terminal thereof connected to the line which receives the $\phi_1$ signal and the source terminal thereof connected to ground.

A further transistor 68 is connected to receive the input signal $\phi_2$ at the gate terminal thereof. The drain terminal of transistor 68 is connected to node 60 and the source terminal of transistor 68 is connected to ground.

The function of circuit 40 is the same as that of circuit 10 in that the output pin 52 is driven to logic states in response to the input signal $\phi_1$. Further, circuit means are provided for limiting the current flow through transistor 48 of circuit 40 when pin 52 is grounded.

When the input signal $\phi_1$ is at a low voltage state and the input signal $\phi_2$ is at a low voltage state transistors 42, 45, 66, 67 and 68 are turned off. When the transistors 42 and 45 are turned off node 44 is pulled to a high voltage state by transistor 46. Note that the voltage state at node 44 can be limited as described below. The high voltage state on node 44 turns on transistor 48 thereby pulling node 50 to a high state. Thus the low voltage state of signal $\phi_1$ produces a high voltage state at the output pin 52. Node 50 is isolated from ground since transistor 66 is turned off.

When the input signal $\phi_1$ is at a high voltage state and the input signal $\phi_2$ is at a low voltage state transistors 42 and 66 will be turned on while transistors 45, 67 and 68 will be turned off. When transistor 42 is turned on node 44 is pulled to ground thereby turning off transistor 48. When transistor 66 is turned on the output node 50 is pulled to ground thereby driving the output pin 52 to a low voltage state. Thus the logic state at output 52 is the complement of the logic state of signal $\phi_1$ when output disable signal $\phi_2$ is at a low voltage state.

When the input terminal $\phi_2$ is at a low voltage state transistor 68 is turned off thereby permitting transistors 58 and 64 to be turned on or off depending upon the voltage differential between nodes 44 and 50.

Whenever the input signal $\phi_2$ goes to a high voltage state transistors 45, 67 and 68 will be turned on. When transistor 45 is turned on node 44 is pulled to a low voltage state thereby turning off transistor 48. When transistor 67 is turned on the line carrying signal $\phi_1$ is forced to ground thereby turning transistor 66 off. When transistor 68 is turned on the node 60 is pulled to a low voltage state thereby turning off transistors 64 and 58. With transistors 48, 64, 66 and 68 turned off node 50 is left in a floating condition thereby providing a high impedance to the output pin 52. The high impedance condition is produced whenever the input signal $\phi_2$ goes to a high voltage state.

The transistor 58 is fabricated to have a substantially greater "on" impedance than that of either of the transistors 54 and 56. When the gate-to-source voltage of transistor 48 exceeds the combined voltage thresholds ($V_T$) of transistors 54, 56 and 58, these transistors will be turned on. But when the gate-to-source voltage of transistor 48 is less than the combined voltage thresholds of transistors 54, 56 and 58, these transistors will be turned off. Since the impedance of transistor 58 is substantially greater than that of transistors 54 and 56 when all three transistors are turned on, most of the voltage difference in excess of 2 $V_t$ between nodes 44 and 50 will be developed between nodes 60 and 50. This serves to turn on transistor 64 to reduce the voltage on node 44 to approximately 3 $V_t$ above that of node 50. Therefore, if node 44 should be at a high state and pin 52 should become grounded the transistors 54, 56 and 58 will be turned on thereby applying a positive bias to the gate terminal of transistor 64 which is then turned on to lower the voltage on node 44 thereby limiting the current flow through transistor 48.

The "on" impedance of transistor 64 is made to be substantially less than that of transistor 46 such that the maximum voltage on node 44 can be limited to slightly more than 3 $V_t$ above the voltage at node 50.

Although the circuit 40 provides essentially the same function as that of circuit 10 it offers substantial space savings over that of circuit 10. In a typical design example the transistors 54 and 56 can be 20 microns wide while the transistor 58 is made five microns wide. The transistor 64 is fabricated to be 100 microns wide. It can be seen that the combined serial "on" impedance of transistors 18, 20 and 22 in FIG. 1 is essentially equal to the "on" impedance of transistor 64. Thus, the circuit 40 utilizes approximately 145 units of area while the circuit of FIG. 1 utilizes approximately 900 units of area. The current limiting portion of circuit 40 provides essentially the same current limiting function as circuit 10 but has approximately a factor of six savings in area on an integrated circuit chip.

The transistors 45, 67 and 68 are included in circuit 40 to provide a high impedance state to output pin 52. If such a high impedance state is not required, these transistors can be deleted from circuit 40.

In summary the present invention comprises a current limiting driver circuit in which the output terminal can be rapidly charged and pulled to a relatively high voltage state but with the provision that the maximum current through the driver transistor is limited to a predetermined safe level.

Unless otherwise noted the transistors described herein are n-channel, enhancement mode devices, however, it is recognized that an equivalent circuit can be fabricated using p-channel type devices.

Although two embodiments of the invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention.

I claim:

1. A current limiting MOS transistor circuit for driving an output node, comprising:
   a driver transistor having the gate terminal thereof connected to receive a control signal, the drain terminal thereof connected to a power terminal, and the source terminal thereof connected to said output node, and
   means connected between the gate and source terminals of said driver transistor for limiting the maximum voltage difference therebetween to a predetermined voltage thereby limiting the current flow through said driver transistor, wherein said means for limiting comprises a plurality of serially connected transistors each having the gate and drain terminals thereof connected together, the first of said transistors having the gate and drain terminals thereof connected to the gate terminal of said driver transistor, each succeeding transistor having the gate and drain terminals thereof connected to the source terminal of the preceeding transistor and the last of said transistors having the source terminal thereof connected to the source terminal of said driver transistor.

2. A current limiting MOS transistor circuit for driving an output node, comprising;
   a driver transistor having the gate terminal thereof connected to receive a control signal, the drain terminal thereof connected to a power terminal, and the source terminal thereof connected to said output node,
   means connected between the gate and source terminals of said driver transistor for limiting the maximum voltage difference therebetween to a predetermined voltage thereby limiting the current flow through said driver transistor,
   wherein said means for limiting comprises:
   a first transistor having the gate and drain terminals thereof connected to the gate terminal of said driver transistor,
   a second transistor having the gate and drain terminals thereof connected to the source terminal of said first transistor, and
   a third transistor having the gate and drain terminals thereof connected to the source terminal of said second transistor and the source terminal thereof connected to the source terminal of said driver transistor.

3. The current limiting MOS transistor circuit recited in claim 2 including an impedance element connected between the gate terminal of said driver transistor and said power terminal and wherein the combined "on" impedance of said first, second and third transistors is substantially less than that of said impedance element.

4. The current limiting MOS transistor circuit recited in claim 2 wherein said first, second and third transistors have essentially equal channel widths and have essentially equal channel lengths.

5. The current limiting MOS transistor circuit recited in claim 1 or 2 including means responsive to an input signal for placing said output node in a high impedance state.

6. A current limiting MOS transistor circuit for driving an output node, comprising:
   a driver transistor having the gate terminal thereof connected to receive a control signal, the drain terminal thereof connected to a power terminal, and the source terminal thereof connected to said output node,
   means connected between the gate and source terminals of said driver transistor for limiting the maximum voltage difference therebetween to a predetermined voltage thereby limiting the current flow through said driver transistor,
   wherein said means for limiting comprises:
   a first transistor having the gate and drain terminals thereof connected to the gate terminal of said driver transistor,
   a second transistor having the gate and drain terminal thereof connected to the source terminal of said first transistor, a third transistor having the gate and drain terminals thereof connected to the source terminal of said second transistor, and the source terminal thereof connected to said output node, and a fourth transistor having the gate terminal thereof connected to the drain terminal of said third transistor, the drain terminal thereof connected to the gate terminal of said driver transistor and the source terminal thereof connected to said output node.

7. The current limiting MOS transistor circuit recited in claim 6 wherein the "on" impedance of said third transistor is substantially greater than the combined "on" impedance of said first and second transistors.

8. The current limiting MOS transistor circuit recited in claim 7 wherein the "on" impedance of said fourth transistor is substantially less than that of said first and second transistors.

9. The current limiting MOS transistor circuit recites in claim 6 including means responsive to an input signal for placing said output node in a high impedance state.

10. A current limiting MOS transistor circuit for driving an output node, comprising:
a depletion mode pull-up transistor having the gate and source terminals thereof connected to a first node and the drain terminal thereof connected to a first power terminal,
an input transistor having the gate terminal thereof connected to receive a first input signal, the drain terminal thereof connected to said first node and the source terminal thereof connected to a second power terminal,
a first transistor having the gate and drain terminals thereof connected to said first node,
a second transistor having the gate and drain terminals thereof connected to the source terminal of said first transistor,
a third transistor having the gate and drain terminals thereof connected to the source terminal of said second transistor and the source terminal thereof connected to said output node,
a driver transistor having the gate terminal thereof connected to said first node, the drain terminal thereof connected to said first power terminal and the source terminal thereof connected to said output node, and
a pull-down transistor having the gate terminal thereof connected to receive said first input signal, the drain terminal thereof connected to said output node and the source terminal thereof connected to said second power terminal.

11. The current limiting MOS transistor circuit recited in claim 10 including a fourth transistor having the gate terminal thereof connected to receive a disable signal, the drain terminal thereof connected to said first node and the source terminal thereof connected to said second power terminal and a fifth transistor having the gate terminal thereof connected to receive said disable signal, the drain terminal thereof connected to the gate terminal of said pull-down transistor and the source terminal thereof connected to said second power terminal.

12. The current limiting MOS transistor circuit recited in claim 10 wherein the combined "on" impedance of said first, second and third transistors is substantially less than that of said pull-up transistor.

13. A current limiting MOS transistor circuit for driving an output node, comprising:
a depletion mode pull-up transistor having the gate and source terminals thereof connected to a first node and the drain terminal thereof connected to a first power terminal,
an input transistor having the gate terminal thereof connected to receive a first input signal, the drain terminal thereof connected to said first node and the source terminal thereof connected to a second power terminal,
a first transistor having the gate and drain terminals thereof connected to said first node,
a second transistor having the gate and drain terminals thereof connected to the source terminal of said first transistor,
a third transistor having the gate and drain terminals thereof connected to the source terminal of said second transistor and the source terminal thereof connected to said output node,
a fourth transistor having the gate terminal thereof connected to the source terminal of said second transistor, the drain terminal thereof connected to said first node and the source terminal thereof connected to said output node,
a pull-down transistor having the gate terminal thereof connected to receive said first input signal, the drain terminal thereof connected to said output node and the source terminal thereof connected to said second power terminal, and
a driver transistor having the gate terminal thereof connected to said first node, the drain terminal thereof connected to said first power terminal and the source terminal thereof connected to said output node.

14. The current limiting MOS transistor circuit recited in claim 13 including:
a fifth transistor having the gate terminal thereof connected to receive a disable signal, the drain terminal thereof connected to the gate terminal of said pull-down transistor and the source terminal thereof connected to said second power terminal,
a sixth transistor having the gate terminal thereof connected to receive said disable signal, the drain terminal thereof connected to said first node and the source terminal thereof connected to said second power terminal, and
a seventh transistor having the gate terminal thereof connected to receive said disable signal, the drain terminal thereof connected to the gate terminal of said fourth transistor and the source terminal thereof connected to said second power terminal.

15. The current limiting driver circuit recited in claim 13 wherein the "on" impedance of said first and second transistors is less than that of said third transistor and the "on" impedance of said fourth transistor is less than that of said pull-up transistor.

* * * * *